United States Patent [19]
Nakagome et al.

[11] Patent Number: 4,958,325
[45] Date of Patent: Sep. 18, 1990

[54] LOW NOISE SEMICONDUCTOR MEMORY

[75] Inventors: Yoshinobu Nakagome, Albany, Calif.; Kiyoo Itoh, Higashikurume, Japan; Masakazu Aoki, Tokorozawa, Japan; Shin'ichi Ikenaga, Koganei, Japan; Masashi Horiguchi, Kokubunji, Japan; Hitoshi Tanaka, Tachikawa, Japan

[73] Assignee: Hitachi, Ltd., Tokyo, Japan

[21] Appl. No.: 238,375

[22] Filed: Aug. 31, 1988

[30] Foreign Application Priority Data

Sep. 4, 1987 [JP] Japan ................................. 62-220224
Sep. 18, 1987 [JP] Japan ................................. 62-232116

[51] Int. Cl.⁵ ........................ G11C 7/00; G11C 7/02; G11C 11/404
[52] U.S. Cl. .................................... 365/206; 365/207; 365/63
[58] Field of Search ................... 365/51, 63, 206, 207, 365/208, 210, 189.01

[56] References Cited

U.S. PATENT DOCUMENTS 3,305,846  2/1967  Amemiya .
3,942,164  3/1976  Dunn ...................................... 365/63

FOREIGN PATENT DOCUMENTS 0167281  1/1986  European Pat. Off. .............. 365/63
62-51096  3/1987  Japan .

OTHER PUBLICATIONS

IBM Technical Disclosure Bulletin; vol. 24, No. 9; Feb. 1982; pp. 4800–4801.

Primary Examiner—Stuart N. Hecker
Assistant Examiner—Alyssa H. Bowler
Attorney, Agent, or Firm—Pennie & Edmonds

[57] ABSTRACT

A highly integrated semiconductor memory, particularly, a low noise dynamic memory. As the density of integration of the dynamic memory increases, the distance between data lines decreases and a new type of noise, which has hitherto been thought little of, displays itself. To cope with this problem in the semiconductor memory comprising a plurality of pairs of data lines arranged in substantially parallel relationship with each other, respective pairs having substantially the same electric characteristics, connection means provided in association with the respective data line pairs, a plurality of word lines laid to extend perpendicularly to the data line pairs, at least one memory cell connected to at least one of intersections of the word lines with data lines of the pairs, and a plurality of sense amplifier means respectively connected to the data line pairs to differentially detect signal voltages appearing on each data line pair, the plural data line pairs have an alternate arrangement of a pair of data lines transposed at an even number of places and a pair of data lines transposed at an odd number of places, and the sense amplifier means is operative to change voltage on one of the data lines of a pair to a high-level voltage and voltage on the other of the data lines of the pair of a low-level voltage.

26 Claims, 14 Drawing Sheets

F I G. 1
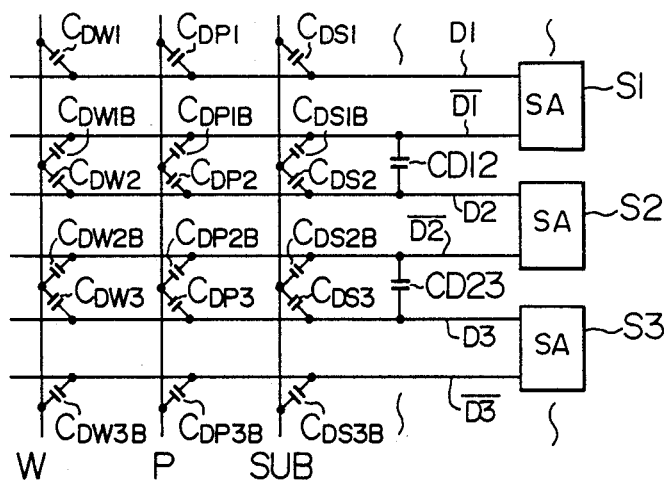
F I G. 2
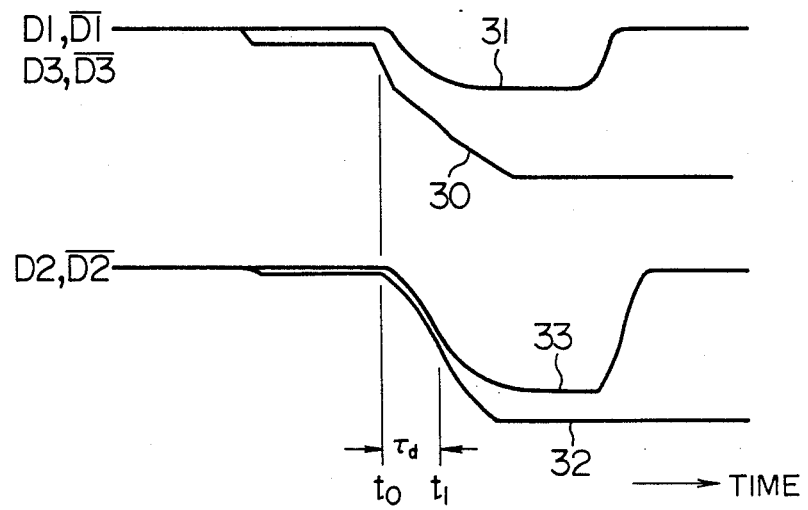

→ TIME

LOW NOISE SEMICONDUCTOR MEMORY

BACKGROUND OF THE INVENTION

This invention relates to semiconductor memories and more particularly to a semiconductor memory having a data line arrangement of folded data line type suitable for realization of a low noise dynamic memory having a wide operating margin.

The inventors of this invention have studied in various points a semiconductor memory of a so-called folded data line type arrangement wherein as shown in FIG. 1, a plurality of fundamental units having each a pair of data lines and a sense amplifier associated therewith are juxtaposed or arranged in parallel with each other. With this arrangement, the paired data lines are affected by a signal line perpendicular thereto through capacitance coupling between the data line pair and the signal line to cause a coupling noise of common mode which can be cancelled out and low noise can be realized very effectively.

However, as the bit density of the semiconductor memory increases, elements of the memory become finer and finer, giving rise to an increase in various kinds of stray capacitance and especially an increase in capacitance coupling between data line pairs, which leads to increased noise. Accordingly, it is indispensable for realization of a highly integrated semiconductor memory that the folded data line type arrangement be reinforced with a countermeasure against this type of noise. The present inventors have analyzed the noise experimentally and theoretically in detail to find out a noise generating mechanism to be described below which has hitherto been unknown.

The process through which the noise is generated will be described with reference to FIG. 1. In FIG. 1, $D1/\overline{D1}$, $D2/\overline{D2}$ and $D3/\overline{D3}$ designate pairs of data lines, S1, S2 and S3 sense amplifiers for amplifying signal voltages on respective data line pairs, W a word line extending perpendicularly to the data line pair, P a plate electrode for applying a fixed voltage to one end of storage capacitor of a memory cell, and SUB a semiconductor substrate. Further, $C_{D12}$ and $C_{D23}$ designate coupling capacitance between adjacent data line pairs, CDW coupling capacitance between the data line pair and the word line, CDP coupling capacitance between the data line pair and the plate electrode, and CDS coupling capacitance between the data line pair and the substrate.

The newly found noise generating mechanism teaches that when a difference in signal voltage is caused by, for example, a hit of an alpha-particle between adjacent data line pairs, a difference in operating timing takes place between a sense amplifier associated with a data line pair and another sense amplifier associated with the adjacent data line pair and the noise which is generated through coupling capacitance is amplified to a level being twice or three times as large as that which is conventionally known. For example, when assuming that signal voltages applied to the data line pairs $D1/\overline{D1}$ and $D3/\overline{D3}$ are larger than those applied to the data line pair $D2/\overline{D2}$ in FIG. 1, waveforms as shown in FIG. 2 appear on the data line pairs during the operation of the sense amplifiers associated with the data line pairs. When larger signal voltages on the data line pairs $D1/\overline{D1}$ and $D3/\overline{D3}$ begin to be amplified at time $t_o$, signal voltages appearing on the data line pair $D2/\overline{D2}$ are too small to permit the gate/source voltage of the MOS transistor constituting the sense amplifier associated with the data line pair $D2/\overline{D2}$ exceed a threshold voltage and are not amplified yet. When voltage on the data line D1 or D3 is amplified to a low-level voltage in accordance with read information, voltage on the data line is affected by that amplification through capacitance coupling of the coupling capacitance $C_{D23}$ so as to be changed to a low-level voltage more greatly than voltage on the data line $\overline{D2}$. Conversely, when voltage on the data line $\overline{D1}$ or $\overline{D3}$ amplified to the low-level voltage, voltage on the data line D2 is affected by that amplification through capacitance coupling of the coupling capacitance $C_{D12}$ so as to be changed to a low-level voltage more greatly than voltage on the data line $\overline{D2}$.

Accordingly, during an interval of delay time $\tau_d$ ($=t_1-t_0$) preceding the initiation of amplification by the sense amplifier associated with the data line pair $D2/\overline{D2}$, the voltage on the data line pair $D2/\overline{D2}$ affected by the voltage on the adjacent data line pair through capacitance coupling to cause a voltage change which is equivalent to a noise.

In this manner, the newly found noise which depends on the distribution of the read information (data pattern dependent noise) is generated.

In the above example in which amplification proceeds in only one direction, there arises an additional problem that sensitivity of the sense amplifier is degraded and the data pattern dependent noise grows. As shown in FIG. 1, principal capacitance associated with the data line includes capacitance $C_{DW}$ between the word line and the data line, capacitance $C_{DP}$ between the plate electrode and the data line and capacitance $C_{DS}$ between the substrate and the data line. When larger signal voltages on a majority of data line pairs including the data line pairs $D1/\overline{D1}$ and $D3/\overline{D3}$ are amplified, the half of all of the data lines changes to the low-level voltage and the non-selected word lines W, plate electrode P and substrate SUB are affected by the data lines through capacitance coupling to change to the low-level voltage. This voltage change causes, through capacitance coupling, lower signal voltage on the data line pair $D2/\overline{D2}$ to assume a change to a low-level voltage. This further retards the operating timing for the sense amplifier associated with the data line pair $D2/\overline{D2}$ and the voltage, still remaining not amplified, decreases greatly. Since the capacitance associated with the data line principally includes $C_{DW}$, $C_{DP}$ and $C_{DS}$ and the electric impedance of each of the word line, plate electrode and substrate is high, the aforementioned voltage drop is great. As will be seen from the above, when the operating timing for a sense amplifier associated with a particular data line is retarded, the particular data line becomes liable to be affected by other data lines through capacitance coupling and its operating reliability tends to be degraded. Values of the capacitances $C_{DW}$, $C_{DP}$ and $C_{DS}$ depend on characteristics of semiconductor fabrication process and tend to be slightly different for individual data line pairs and the amount of the aforementioned voltage drop is also slightly different for the individual data line pairs, leading to an operating failure.

A method for eliminating the former noise or the data pattern dependent noise is disclosed in JP-A-62-51096. In this method, a pair of data lines transposed at an odd number of places, that is, data line pair $D2/\overline{D2}$ and a pair of data lines transposed at an even number of places, that is, data line pair D1/$\overline{D1}$ or D3/$\overline{D3}$ are arranged alternately as illustrated in FIG. 3a. There are seen in FIG. 3a memory cells represented by reference numeral 1, word lines W11 to W4N, sense amplifiers S1 to S3, switches Y1 to Y3 for connecting the data lines to common data lines 2 and 3, and a Y decoder 4. This method is called a transposing technique and has already been known as a countermeasure for prevention of interference between a pair of data transmission lines. For example, U.S. Pat. No. 3,305,846 in 1967 describes the transposing technique.

According to this technique, since a pair of data lines transposed at least once, generally, odd times and a pair of data lines transposed at least twice, generally, even times are arranged alternately, changes in voltage caused through capacitance coupling between adjacent data line pairs can be averaged to reduce data pattern dependency.

However, because of the latter problem, that is, the use of the sense amplifier as shown in FIG. 3b in which amplification proceeds in one direction, the newly found amplification of capacitance coupling noise due to delay in operation time of the sense amplifier can not be prevented and degrading the operating margin can not be avoided. Further, it should be noted that no account has conventionally been taken of characteristics of the semiconductor memory. For example, necessity of transposition at least three places prevents high density integration of the memory, a failure to consider data pattern dependent noise due to capacitance coupling in the sense amplifier section leads to a large amount of noise due to the capacitance between lines in the sense amplifier section which occupies several of tens of percent of the capacitance between data lines, and no account is taken of the memory array structure including dummy cells. For these reasons, a practical semiconductor memory having high operating reliability has not been realized yet.

SUMMARY OF THE INVENTION

With a view of solving the above problems, the present invention adopts transposition of the paired data lines and uses a sense amplifier which symmetrically drives the paired data lines to a high-level voltage and a low-level voltage.

For complete cancellation of the data pattern dependent noise, the paired data lines in the sense amplifier section are also transposed.

When applying dummy cells to a plurality of transposed data line pairs, two modes are adopted whereby in one mode, dummy cells are disposed within respective intervals defined by places at which the paired data lines are transposed and in the other mode, disposition of dummy cells within only one interval can suffice by providing an additional wiring layer which connects memory cells to the data lines within respective intervals.

By symmetrically driving the data line pair, delay in operation of the sense amplifier can be minimized even when a common mode voltage change takes place in lower signal voltage appearing on the specified data line pair.

By transposing the paired data lines in the sense amplifier section, the data pattern dependent noise due to possible capacitance coupling between data line pairs can be cancelled out substantially completely.

Further, even when dummy cells are applied, a low noise semiconductor memory can be realized without increasing the chip area and without resort to complicated logical control.

An object of this invention is to provide a low noise semiconductor memory which takes account of effects unique to the semiconductor memory.

Another object of this invention is to provide a highly reliable semiconductor memory.

Still another object of this invention is to provide a semiconductor memory suitable for high-speed operation.

Still another object of this invention is to provide a semiconductor memory which can be realized with a highly integrated circuit.

Still another object of this invention is to provide a semiconductor memory which can minimize the data pattern dependent noise.

Still another object of this invention is to provide a semiconductor memory having a data line arrangement and a sense amplifier layout both of which can minimize the data pattern dependent noise.

These and other objects and many of the attendant advantages of this invention will be readily appreciated and better understood by reference to the following detailed description and accompanying drawings.

BRIEF DESCRIPTION OF THE DRAWINGS

FIG. 1 is a circuit diagram useful in explaining problems the present inventors have found out in the prior art memory arrangement.

FIG. 2 is a diagram illustrating waveforms appearing on data line pairs in operation of the FIG. 1 circuit.

FIG. 15b is a sectional view taken on the line A—A' of FIG. 15a.

FIG. 16 is an equivalent circuit diagram of the sense amplifiers shown in FIG. 15a.

DESCRIPTION OF THE PREFERRED EMBODIMENTS

The invention will now be described by way of example with reference to the accompanying drawings.

In preferred embodiments to be described hereinafter, the sense amplifier is exemplarily comprised of complementary MIS (CMIS) transistors but it may also be constituted by MIS transistors of the same conductivity type or other elements such as for example bipolar transistors as far as it can fulfill the function of the invention to be described subsequently.

Embodiment 1

Figure 3A:
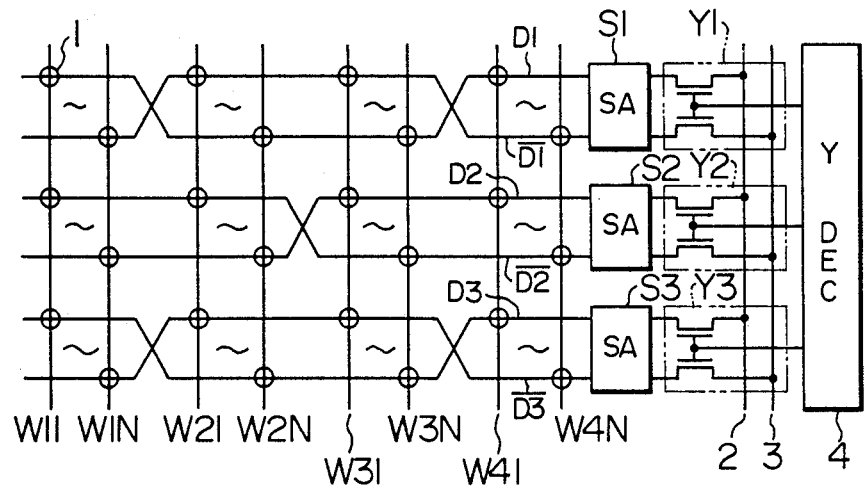
FIGS. 3a and 3b are diagrams for explaining a prior art memory arrangement in which operation characteristics are improved over the FIG. 1 arrangement.
Figure 3B:
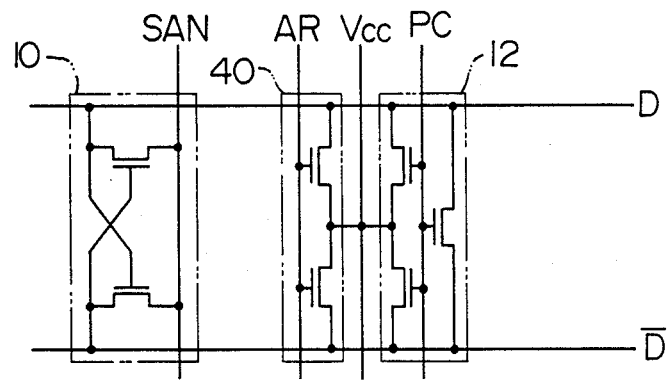
Figure 4A:
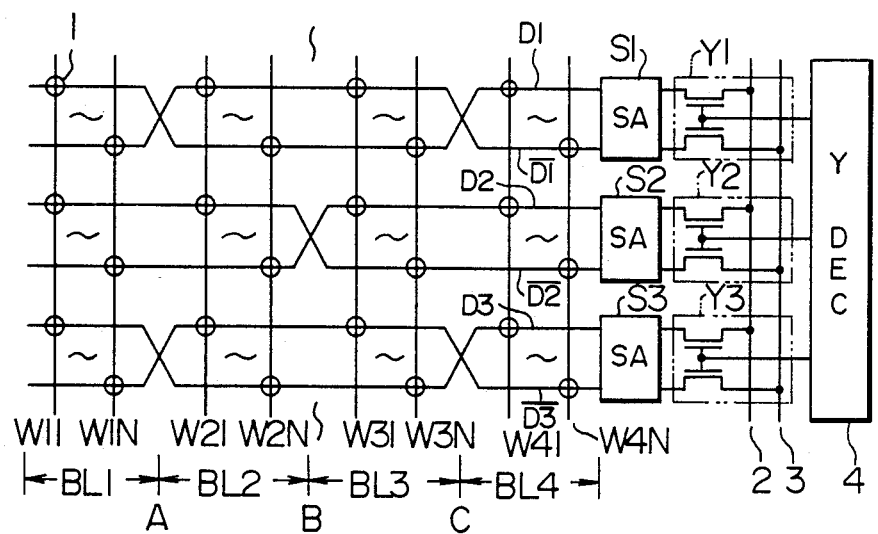
FIGS. 4a and 4b are circuit diagrams for explaining a memory arrangement according to a first embodiment of the invention.
Figure 4B:
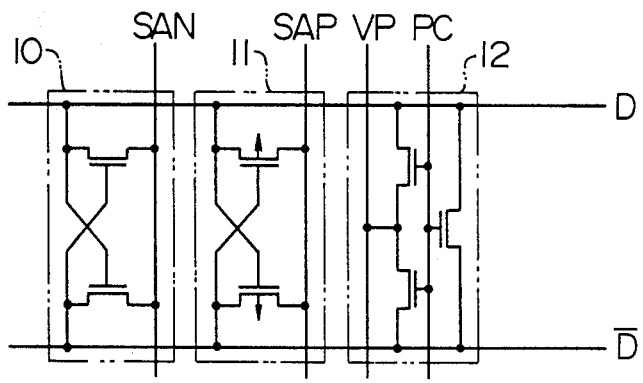

Referring to FIGS. 4a and 4b, a semiconductor memory according to a first embodiment of the invention will be described. The semiconductor memory shown in FIG. 4a comprises memory cells symbolized by circles 1 and having each a single transistor and a single capacitor, word lines W11 to W4N, pairs of data lines D1/$\overline{D1}$, D2/$\overline{D2}$ and D3/$\overline{D3}$, sense amplifiers S1, S2 and S3, Y switches Y1, Y2 and Y3, input/output lines 2 and 3, and a Y decoder 4. One sense amplifier is shown in FIG. 4b and includes a sense amplifier circuit 10 comprised of N-channel MIS transistors that drives one of the data lines in a pair to a low-level voltage, a sense amplifier circuit 11 comprised of P-channel MIS transistors that drives the other of the data lines in the pair to a high-level voltage, and a precharge circuit 12. Denoted by SAN is a drive signal for the N-channel sense amplifier circuit, by SAP is a drive signal for the P-channel sense amplifier circuit, by PC is a precharge signal and by VP a precharge voltage which is set herein to ½ Vcc, where Vcc is a supply voltage of the memory chip.

In this embodiment, a pair of data lines transposed at two places A and C (for example, D1/$\overline{D1}$ or D3/$\overline{D3}$) and a pair of data lines transposed at one place B (for example, D2/$\overline{D2}$) are arranged alternately to form the memory. The three places A, B and C define four intervals BL1 to BL4. By making lengths of respective intervals equal to each other, a specified data line can be made to be equidistant from four data lines of two pairs of data lines which are adjacent to a pair of data lines containing the specified data line. For example, when taking the data line D2 for a specified data line, this specified data line is equidistantly adjacent to the data line D3 within the interval BL1, to the data line $\overline{D3}$ within the interval BL2, to the data line $\overline{D1}$ within the interval BL3 and to the data line D1 within the interval BL4 and therefore voltage on the data line D2 is affected by the data lines D1, $\overline{D1}$, D3 and $\overline{D3}$ through capacitance coupling to change by an average of changes in voltages on the data lines D1, $\overline{D1}$, D3 and $\overline{D3}$. Similarly, the data line $\overline{D2}$ is also affected by the data lines D1, $\overline{D1}$, D3 and $\overline{D3}$ through capacitance coupling and unless variation in coupling capacitance is taken into consideration, the data lines D2 and $\overline{D2}$ undergo voltage changes which are identical to each other in phase and amount. Furthermore, since a pair of the data lines D1 and $\overline{D1}$ and a pair of the data lines D3 and $\overline{D3}$ are driven such that voltage on the data lines of each pair changes symmetrically in positive-going and negative-going directions, the data line D2 or $\overline{D2}$ is affected by the data lines D1, $\overline{D1}$, D3 and $\overline{D3}$ through capacitance coupling to cause no voltage change and consequently the delay in operation of the sense amplifier can be minimized to make erroneous operation due to noise hardly occur.

At that time, voltage waveforms as illustrated in FIG. 4 appear on the respective data lines. Where the voltage transition speed of the sense amplifier driving signals SAN and SAP is a [V/sec] and the initial difference in signal voltage between each of the pairs D1/$\overline{D1}$ and D3/$\overline{D3}$ and the pair D2/$\overline{D2}$ is $\Delta$Vs [V], delay $\tau_{dl}(=t_1-t_0)$ in operating the sense amplifier associated with the pair D2/$\overline{D2}$ is given by $$\tau_{dl} = \Delta Vs/a \, [\text{sec}].$$

This value does not depend on the distribution of storage information and is constant. This delay is smaller than the delay of the sense amplifier which is so driven as to change voltage on the data line in one direction and can minimize the possibility of occurrence of erroneous operations. Considering that voltages on the paired data lines change symmetrically, it is desirable that the precharge voltage VP for the data lines lie substantially in the middle between maximum and minimum values defining the range of change of voltage on the data lines.

Figure 5:
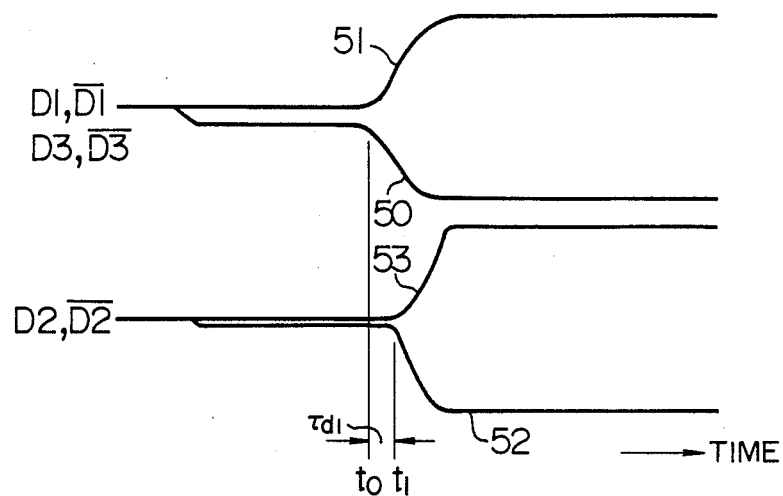
FIG. 5 is a diagram illustrating waveforms appearing on data line pairs in operation of the first embodiment.
Figure 6:
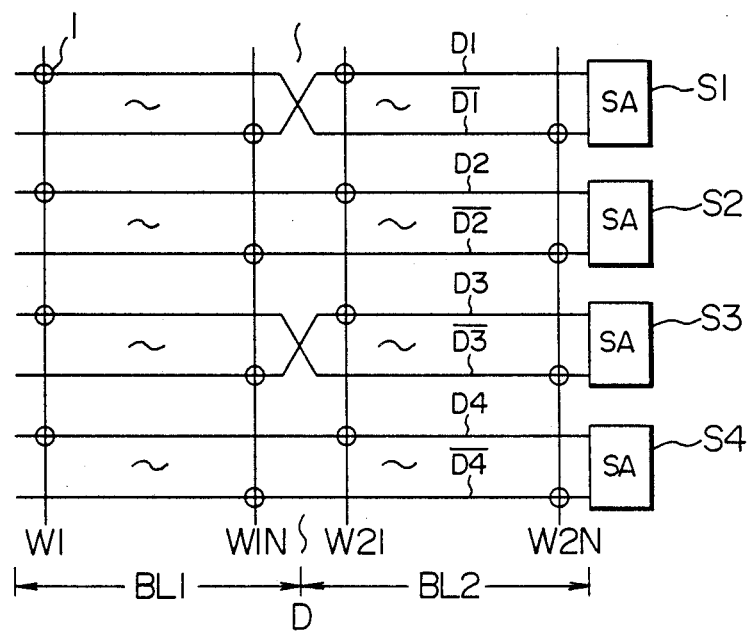
FIG. 6 is a circuit diagram illustrating a modification of the first embodiment.

By making the voltages on the data line pair change symmetrically at the initiation of operation of the sense amplifier, the number of transpositions can be minimized in forming a low noise memory. FIG. 6 illustrates a modification of the conventional FIG. 5a memory wherein a pair of data lines having the number of transpositions equal to zero (for example, D2/$\overline{D2}$ or D4/$\overline{D4}$) and a pair of data lines having the number of transpositions equal to one (for example, D1/$\overline{D1}$ or D3/$\overline{D3}$ are arranged alternately to form a memory. When paying attention to the data line pair D3/$\overline{D3}$, the data line D3 is affected by the data lines $\overline{D2}$ and D4 through capacitance coupling and the data line $\overline{D3}$ is also affected by the data lines $\overline{D2}$ and D4 through capacitance coupling. Accordingly, both of the data lines D3 and $\overline{D3}$ are equally affected by an average of changes in voltages on the data lines D2 and D4. In reference to the data line pair D2/$\overline{D2}$, the data line D2 is affected by the data lines D1 and $\overline{D1}$ through capacitance coupling and the data line $\overline{D2}$ is affected by the data lines D3 and $\overline{D3}$ through capacitance coupling. In the former case, common mode voltage changes occur on the data line pair D3/$\overline{D3}$ but they do not lead to a data pattern dependent noise. In the latter case, as far as voltages on the data lines D1 and $\overline{D1}$ change symmetrically and voltages on the data lines D3 and $\overline{D3}$ change symmetrically, there occur no common mode voltage changes and no data pattern dependent noise on the data line pair D2/$\overline{D2}$.

Figure 7:
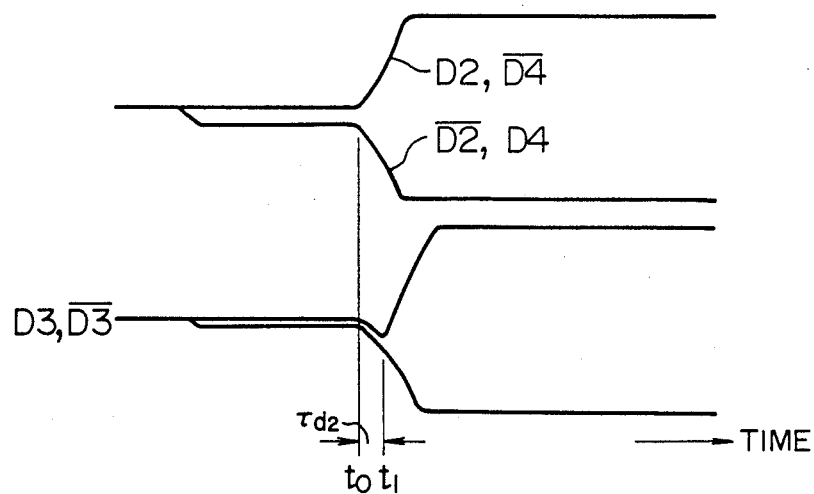
FIG. 7 is a diagram illustrating waveforms appearing on data line pairs in operation of the FIG. 6 modification.

Thus, this modification can also cancel out the data pattern dependent noise. Especially, in the former case in this modification, common mode voltage changes occur on the data line pair D3/$\overline{D3}$. For example, as shown in FIG. 7, the data lines D2 and $\overline{D4}$ tend to change to the high-level voltage and the data lines $\overline{D2}$ and D4 tend to change to the low-level voltage. In this procedure, while the N-channel sense amplifier is delayed in operating, the P-channel sense amplifier initiates operation rather earlier. Accordingly, in this case, delay time $\tau_{d2}(=t_1-t_0)$ required for initiation of amplification is indicated in accordance with the previous expression as follows:

$$\tau_{d2} < \Delta V_s/\alpha = \tau_{d1}$$

demonstrating that delay time $\tau_{d2}$ is more reduced than $\tau_{d1}$.

As described above, by providing the sense amplifier which can drive the paired data lines symmetrically to the high-level voltage and to the low-level voltage, the data pattern dependent noise can be cancelled and variation in time for initiation of amplification by the sense amplifier can be minimized in the presence of variation in signal voltage even when the memory is formed using the data line pair having a minimal number of transpositions.

Embodiment 2

Figure 8:
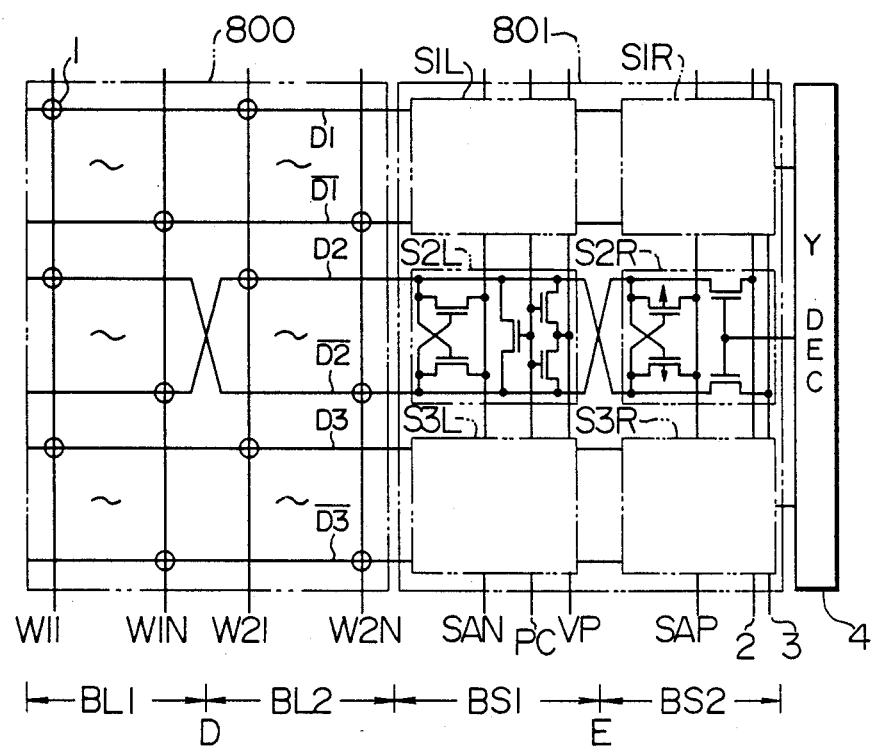
FIG. 8 is a circuit diagram illustrating a memory arrangement according to a second embodiment of the invention.

Referring to FIG. 8, there is illustrated a semiconductor memory according to a second embodiment of the invention. In FIG. 8, reference numeral 800 designates a memory cell array and 801 a sense amplifier section.

In this embodiment, the paired data lines in the memory cell array are transposed to cancel out the data pattern dependent noise and the paired data lines in the sense amplifier section are also transposed. Typically, transposition in the sense amplifier section is selectively effected at a place E defining two intervals BS1 and BS2 in which coupling capacitance between adjacent data lines within one interval is equal to that within the other interval. By this, the data pattern dependent noise at the initiation of operation of the sense amplifier can be cancelled out substantially completely. Especially where the connection of the data line pair in the memory cell array to the data line pair in the sense amplifier section is controlled by, for example, MIS switches, the noise due to the capacitance coupling is less generated in the memory cell array through the medium of resistance of the MIS switches but more generated in the sense amplifier section. In such an instance, the transposition of the paired data lines in the sense amplifier section may preferably be adopted as in this embodiment to greatly reduce the data pattern dependent noise.

Embodiment 3

Figure 9:
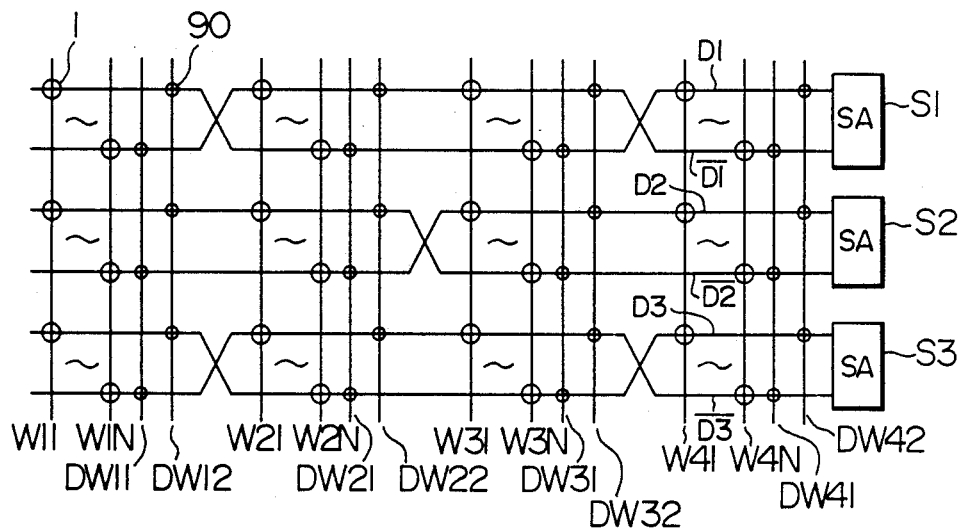
FIGS. 9 and 10 are circuit diagrams for explaining a memory arrangement using dummy cells according to a third embodiment of the invention.
Figure 10:
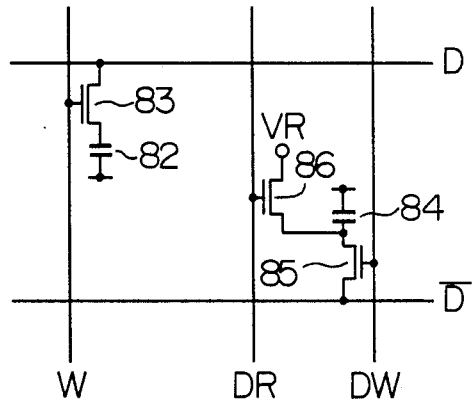

FIG. 9 illustrates a semiconductor memory according to a third embodiment of the invention. In FIG. 9, reference numeral 90 designates dummy cells, and DW11 to DW42 designate dummy word lines. The construction of the memory cell and dummy cell is exemplified in FIG. 10 in which 82 denotes a storage capacitor of the memory cell, 84 a storage capacitor of the dummy cell, 83 and 85 transfer MIS transistors, 86 a transistor for resetting the dummy cell capacitor, W a word line, DW a dummy word line, DR a dummy cell reset signal line and VR a dummy cell reset voltage.

In constructing a semiconductor memory, dummy cells are generally used to balance capacitance of the data line pair and capacitance coupling between the word line and the data line pair.

In the memory cell array having transposition of the paired data lines, there arises a problem that in accordance with a selected word line, the sequence of data lines connected with memory cells changes as viewed from the sense amplifier section. For example, when the word line W11 is selected, signals read out of memory cells appear on the data lines D1, $\overline{D2}$ and D3. Similarly, with the word line W21 selected, signals appear on the data lines $\overline{D1}$, $\overline{D2}$ and $\overline{D3}$, with the word line W31 selected, signals appear on the data lines $\overline{D1}$, D2 and $\overline{D3}$ and with the word line W41 selected, signals appear on the data lines D1, D2 and D3. Accordingly, the number of dummy word lines has to be eight which is four times as large as the required when the paired data lines are not transposed. Since, in the half of the dummy cell arrangement, dummy cells can not be arranged every other data line, regularly the layout of the memory cell cannot be applied as it is and a disadvantage of an increased layout area is raised in addition to the disadvantage that the number of dummy cells is four times increased.

However, as shown in FIG. 9, by distributing dummy cells over intervals defined by places at which the paired data lines are transposed, the memory can be realized when the dummy cells are arranged in the conventional manner. In this case, the area occupied by the dummy cells is four times as large as that in the conventional memory.

As described above, this embodiment can suppress an increase in the layout area to minimum while maintaining process compatibility with the conventional memory.

Embodiment 4

Figure 11:
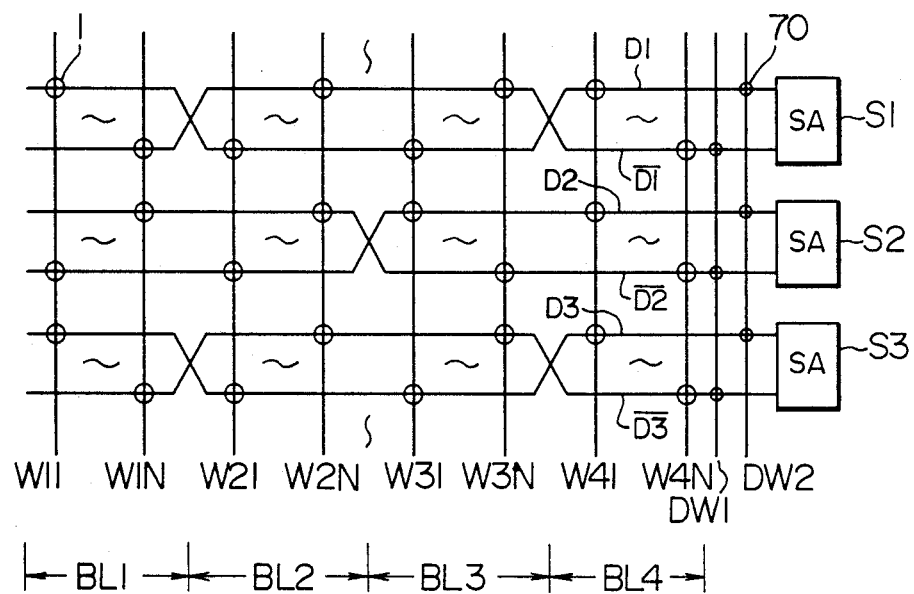
FIG. 11 is a circuit diagram illustrating a memory arrangement according to a fourth embodiment of the invention.

FIG. 11 illustrates a semiconductor memory according to a fourth embodiment of the invention.

In this embodiment, when any one of word lines belonging to each of the plurality of intervals defined by places at which the paired data lines are transposed is selected, signals read out of memory cells within one interval never fail to appear every other data line. More specifically, with the word line W11, W21, W31 or W41 selected, read-out signals appear on the data lines D1, D2 and D3. Similarly, with the word line W1N, W2N, W3N or W4N selected, read-out signals appear on the data lines $\overline{D1}$, $\overline{D2}$ and $\overline{D3}$. By this, a memory can be formed using dummy cells 70 which are identical in number to those of the conventional memory and an increase in the chip area can be avoided.

Figure 12:
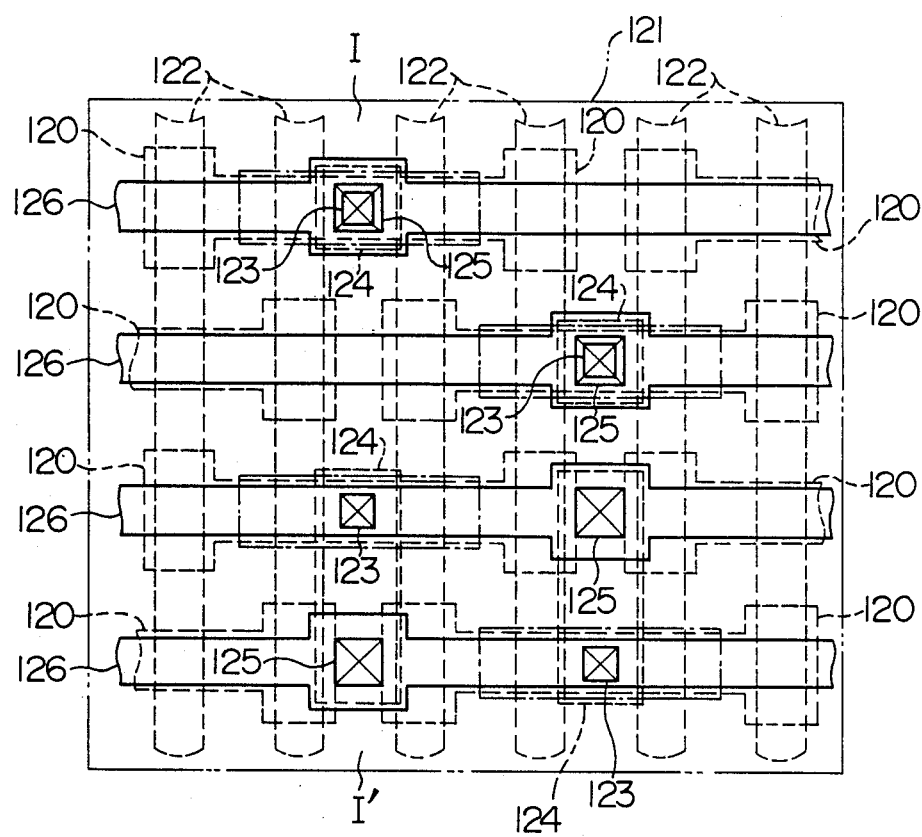
FIG. 12 is a plan view showing the layout of a memory cell array in the FIG. 11 embodiment.
Figure 13:
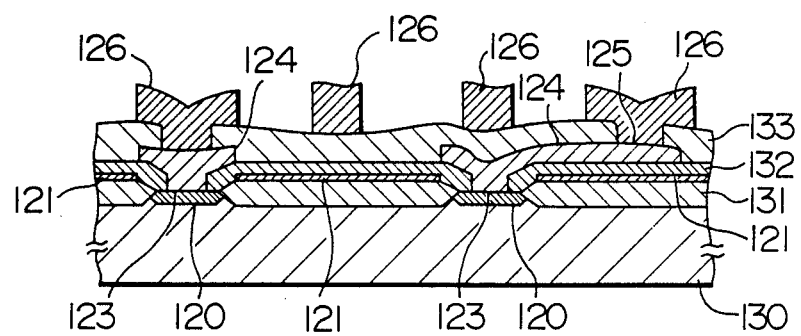
FIG. 13 is a sectional view showing a partial sectional structure of the FIG. 2 layout.

The memory cell arrangement schematically shown in FIG. 11 can be put into practice in a manner as will be described below with reference to FIGS. 12 and 13. Referring to FIG. 12, reference numeral 120 designates an active area formed in the surface of a semoconductor substrate, 121 a first poly-silicon layer forming a plate electrode used to apply a fixed voltage to one end of the memory cell storage capacitor, 122 a second poly-silicon layer forming a word line, 124 a third poly-silicon layer for electrical connection between the active and a data line, 123 a first level contact hole through which the third poly-silicon layer electrically connects to the active area, 126 an aluminum layer forming a data line, and 125 a second level contact hole through which the aluminum layer electrically connects to the third poly-silicon layer. FIG. 12 is sectioned between points I and I' to provide a sectional struction as shown in FIG. 13 in which reference numeral 130 designates the semiconductor substrate having a conductivity type opposite to that of the active area, and 131, 132 and 133 inter-layer insulating films for providing electrical insulation between adjacent wiring layers.

In the memory as shown in FIG. 11, the connection of memory cells to data lines is difficult to achieve particularly when memory cells selected by a word line are located close to each other every two other data lines, as within the interval BL1 or BL3. This electrical connection can conveniently be accomplished by providing an additional wiring layer between the active area of memory cell and the data line as shown in FIG. 12, the additional wiring layer corresponding to the third poly-silicon layer. In this manner, the memory cell connection shown in FIG. 11 can be obtained.

In accordance with this embodiment, a low noise semiconductor memory in which the paired data lines are transposed can be formed without increasing the number of dummy cells.

Embodiment 5

Figure 14A:
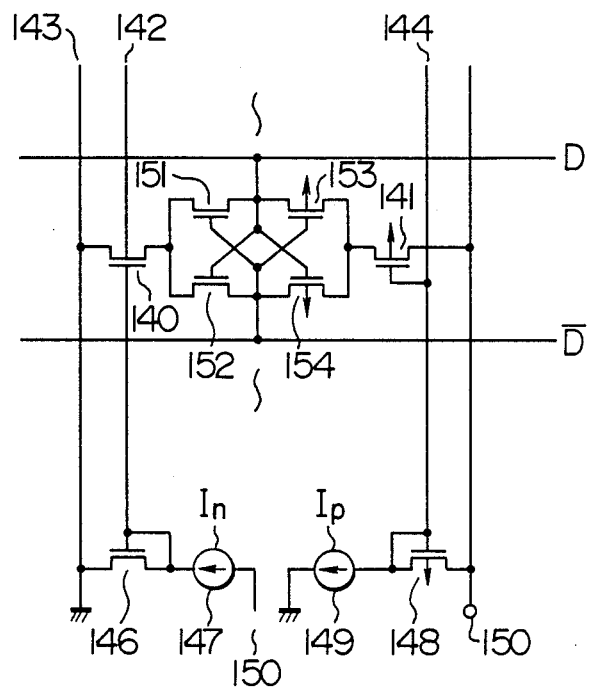
FIGS. 14a and 14b are diagrams for explaining the circuit construction of a sense amplifier according to a fifth embodiment of the invention.
Figure 14B:
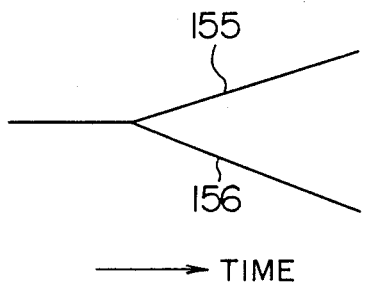

Referring to FIGS. 14a and 14b, a sense amplifier according to a fifth embodiment of the invention will be described.

In FIG. 14a reference numerals 151 and 152 designate paired N-channel MIS transistors forming a sense amplifier circuit that drives one of the data lines in a pair to the low-level voltage, 153 and 154 paired P-channel MIS transistors forming a sense amplifier circuit that drives the other of the data lines in the pair to the high-level voltage, 140 a MIS transistor for driving the low-level voltage sense amplifier circuit, 141 a MIS transistor for driving the high-level voltage sense amplifier circuit, 142 a driving signal line for the low-level voltage sense amplifier circuit, 144 a driving signal line for the high-level voltage sense amplifier circuit, 143 a low-level voltage line, 150 a high-level voltage line, 146 an N-channel MIS transistor for use in setting up the driving current for the low-level voltage sense amplifier circuit, 148 a P-channel MIS transistor for use in setting up the driving current for the high-level voltage sense amplifier circuit, and 147 and 149 constant current sources.

In this embodiment, the transistor 146 cooperates with the transistor 140 to form a current mirror circuit and similarly the transistor 148 cooperates with the transistor 141 to form another current mirror circuit, whereby the low-level voltage sense amplifier circuit is driven by a current proportional to current $I_n$ of the current source 147 and the high-level voltage sense amplifier circuit is driven by a current proportional to current $I_p$ of the current source 149. Accordingly, by setting the ratio between the currents $I_n$ and $I_p$ and the mirror ratio in each mirror circuit to suitable values, the data lines in the pair can respectively be driven to the low-level voltage and high-level voltage at the same change speed to thereby ensure high symmetricity. The sense amplifier of this embodiment can therefore be used in combination with the previously-described memory cell array in which the paired data lines are transposed, so as to provide a memory which is more improved in reducing noise. With the sense amplifier of FIG. 14a, the paired data lines can be driven to assume voltage-level waveforms as shown in FIG. 14b.

With this sense amplifier, since the common sources of sense amplifiers connected to respective data line pairs are separated from each other by transistors 140 and 141, time for a sense amplifier to initiate operation can coincide with time for another sense amplifier to initiate operation and capacitance coupling noise between the data line pairs can be reduced greatly, even when the signal voltage on a data line pair varies with respect to the signal voltage on another data line pair.

As described above, in accordance with this embodiment, capacitance coupling between the data line pairs can be cancelled out substantially completely. Even when the signal on a data line pair varies with respect to the signal on another data line pair, the difference in time for initiation of operation between respective sense amplifiers can be minimized. Thus, this embodiment can provide a low noise semiconductor memory having a wide operating margin.

Embodiment 6

The sense amplifier of the invention may be realized with a layout according to a sixth embodiment of the invention.

Figure 15A:
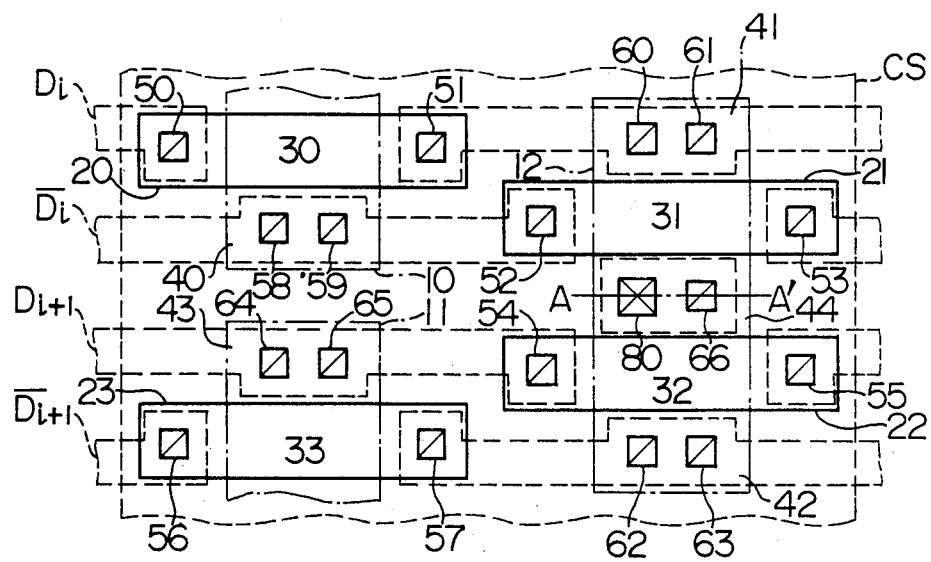
FIG. 15a is a plan view showing a layout of the sense amplifiers according to a sixth embodiment of the invention.
Figure 15B:
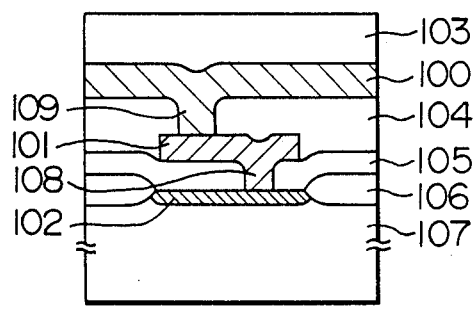
Figure 16:
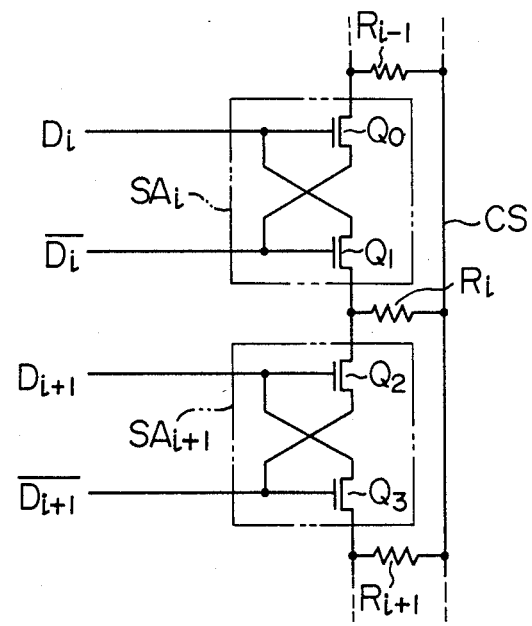

In the memory, particularly, DRAM (dynamic random access memory) of the invention, a layout of sense amplifier as shown in FIGS. 15a and 15b is used. An equivalent circuit of the sense amplifier layout is shown in FIG. 16. In these figures, Di and $\overline{\text{Di}}$ designate a pair of data lines which are aluminum wiring conductors formed on a first layer, CS a sense amplifier driving line which is an aluminum wiring conductor formed on a second layer and extending vertically on the sheet of drawing, 10, 11 and 12 active areas, and 20, 21, 22 and 23 poly-silicon layers. The gate of the N-channel MOS transistor is formed at a portion where the active area overlaps the poly-silicon layer. Areas 30, 31, 32 and 33 in FIG. 15a respectively correspond to gates of MOS transistors $Q_0$, $Q_1$, $Q_2$ and $Q_3$ shown in FIG. 16. The source or drain diffusion layer of the MOS transistor is formed at a portion of the active area not overlapping the poly-silicon layer. Areas 40, 41, 42 and 43 respectively correspond to drain diffusion layers of the MOS transistors $Q_0$, $Q_1$, $Q_2$ and $Q_3$, and an area 44 corresponds to a source diffusion layer common to the transistors $Q_0$ and $Q_1$. There are provided contact holes 50 to 66, and the poly-silicon layer electrically connects to the first layer of aluminum through the contact holes 50 to 57 and the diffusion layer electrically connects to the first layer of aluminum through the contact holes 58 to 66. Denoted by 80 is a throughhole through which the first layer of aluminum connects to the second layer of aluminum.

As shown in an equivalent circuit diagram of FIG. 16, this sense amplifier is a differential amplifier having a pair of N-channel MOS transistors, with the drain of one transistor connected to the gate of the other transistor and the drain of the other transistor connected to the gate of one transistor. Although not shown, memory cells are connected to the data lines Di and $\overline{\text{Di}}$, and a signal voltage read out of a memory cell to develop on the data line $\overline{\text{Di}}$ and a reference voltage appearing on the data line $\overline{\text{Di}}$ (or alternatively, a signal voltage read out of a memory cell to develop on the data line $\overline{\text{Di}}$ and a reference voltage appearing on the data line Di) are differentially amplified. A driving signal CS is applied to cause all of the data line pairs to undergo amplification operation at a time.

Embodiment 7

The layout of the sense amplifier according to the sixth embodiment of the invention has however disadvantages as will be described below.

Referring to FIG. 15b, there is illustrated a sectional view taken on the line A-A' of FIG. 15a. In FIG. 15b, reference numeral 100 designates a second layer of aluminum (sense amplifier driving line CS), 101 a first layer of aluminum, 102 a diffusion layer, 103 a protection film, 104 and 105 inter-layer insulating films, 106 a SiO$_2$ layer, and 107 a silicon substrate. On the way of a current flow path extending from the diffusion layer 102 to the second aluminum layer 100, there exists parasitic resistance associated with a contact hole 108, wiring conductors on the first aluminum layer 101 and a throughhole 109. This parasitic resistance is inserted between a MOS transistor constituting the sense amplifier and the sense amplifier driving line CS, as represented by Ri in the equivalent circuit diagram of FIG. 16. Since the diffusion layer 102 is commonly shared by the MOS transistors Q$_1$ and Q$_2$, the parasitic resistance R$_i$ is also commonly shared by adjacent two sense amplifiers SA$_i$ and SA$_{i+1}$. This parasitic resistance R$_i$ adversely affects the operation as will be described below.

Figure 17:
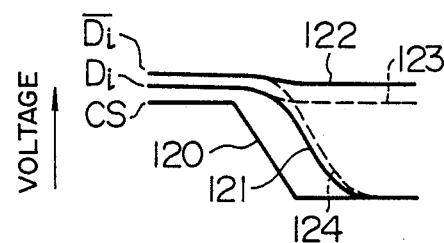
FIG. 17 is a diagram illustrating waveforms appearing in operation of the sense amplifier.

In operation, waveforms as exemplified in FIG. 17 appear in the sense amplifier. In the operation shown in FIG. 17, a signal voltage read out of a memory cell to develop on the data line D$_i$ is lower than a reference voltage on the data line $\overline{D_i}$. The sense amplifier driving line CS is recently set to a high-level voltage. Under this condition, the gate/source voltage of each of the two MOS transistors Q$_0$ and Q$_1$ constituting the sense amplifier SA$_i$ is below a threshold voltage V$_{TH}$ and no current flows through these transistors.

Subsequently, as the potential on the CS line falls as indicated at 120 in FIG. 17, the gate/source voltage of teach of the MOS transistors Q$_0$ and Q$_1$ increases. Since the potential at the gate of transistor Q$_1$ or on the date line D$_i$ is higher than the potential on the data line $\overline{D_i}$, the gate/source voltage of transistor Q$_1$ exceeds the threshold voltage V$_{TH}$ earlier than the gate/source voltage of transistor Q$_0$. As a result, the transistor Q$_1$ is rendered conductive earlier, so that current flows from the data line D$_i$ to the sense amplifier driving line CS to decrease the potential on the data line D$_i$ as indicated at 121. The potential on the data line $\overline{D_i}$, on the other hand, remains unchanged. Thus, this sense amplifier detects and amplifies a slight difference between the gate/source voltages.

Assuming now that potential on data line D$_{i+1}$ is higher than potential on data line $\overline{D_{i+1}}$ in the adjacent data line pair, a sense amplifier SA$_{i+1}$ operates to permit current to flow from the data line $\overline{D_{i+1}}$ to the sense amplifier driving line CS through the MOS transistor Q$_2$. This current flow causes a voltage drop across the parasitic resistance R$_i$, thereby increasing source potential of the MOS transistor Q$_1$. Consequently, the gate/source voltage of transistor Q$_1$ is decreased and the difference between the gate/source voltages of the transistors Q$_0$ and Q$_1$ is decreased. This decreased difference interferes as noise with the sense amplifier SA$_i$ to decrease the operating margin thereof correspondingly. In an extreme, the gate/source voltage of transistor Q$_1$ becomes smaller than that of transistor Q$_0$, leading to an erroneous operation wherein the potential on the data line $\overline{D_i}$ falls as indicated at 124 in FIG. 17.

Conversely, when the potential on the data line $\overline{D_{i+1}}$ is higher than the potential on the data line D$_{i+1}$ in the adjacent data line pair, the aforementioned phenomenon does not occur. In this manner, a data pattern dependent noise takes place wherein the operation of a data line of interest is affected by data read out to develop on the adjacent data line.

This problem is aggravated as the density of integration of semiconductor memory increases. This is because the number of wiring layers must be increased and the width of a wiring conductor and the diameter of a contact hole and a throughhole for interconnection of wiring layers must be minimized in order to realize high density of integration but the above requirements tend to increase the parasitic resistance R$_i$.

A seventh embodiment of the invention intends to provide a layout of sense amplifier by which the data pattern dependent noise can be eliminated.

To this end, in accordance with the seventh embodiment, the paired MOS transistors constituting the sense amplifier commonly share a source diffusion layer and a current flow path extending from the source diffusion layer to the sense amplifier driving signal line.

With the layout as above, parasitic resistance associated with the source of the MOS transistors constituting a sense amplifier can be prevented from being shared by the adjacent sense amplifier. This is effective to suppress the data pattern dependent noise.

Only for the purpose of preventing the parasitic resistance from being commonly shared by adjacent sense amplifiers, it is conceivable that source diffusion layers of all MOS transistors of the adjacent sense amplifiers are separated from each other. But such an expedient increases the layout area considerably. This embodiment in which the source diffusion layer is commonly shared by the paired MOS transistors constituting the sense amplifier succeeds in making the layout area substantially equal to that of the conventional layout.

Figure 18:
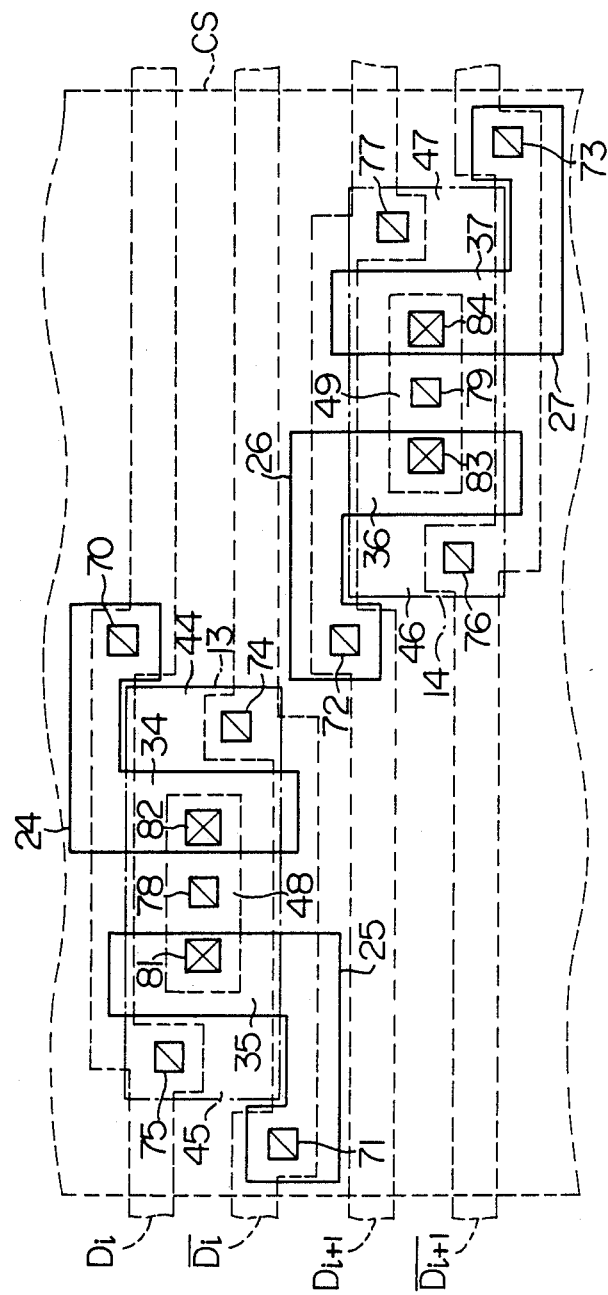
FIG. 18 is a plan view showing a layout of the sense amplifiers according to a seventh embodiment of the invention.
Figure 19:
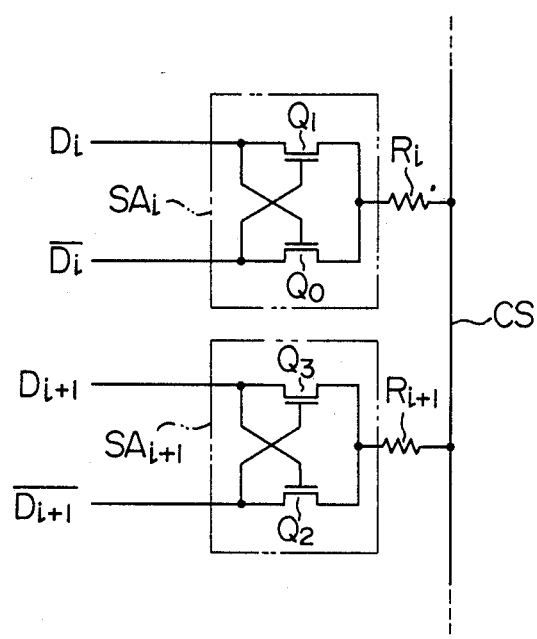
FIG. 19 is an equivalent circuit diagram of the sense amplifiers shown in FIG. 18.

To describe the seventh embodiment more specifically, reference should be made to FIG. 18 illustrating the layout of sense amplifier according to the seventh embodiment of the invention and to FIG. 19 being an equivalent circuit diagram of the FIG. 18 sense amplifier layout. In these figures, D$_i$ and $\overline{D_i}$ designate a pair of data lines, CS a sense amplifier driving line, 13 and 14 active areas, 24, 25, 26 and 27 polysilicon layers, 34, 35, 36 and 37 gates of N-channel MOS transistors Q$_0$, Q$_1$, Q$_2$ and Q$_3$, 44, 45, 46 and 47 drain diffusion layers of the transistors Q$_0$, Q$_1$, Q$_2$ and Q$_3$, 48 a source diffusion layer common to the transistors Q$_0$ and Q$_1$, 49 a source diffusion layer common to the transistors Q$_2$ and Q$_3$, 70 to 73 contact holes through which the poly-silicon layer electrically connects to the first layer of aluminum, 74 to 79 contact holes through which the diffusion layer electrically connects to the first aluminum layer, and 81 to 84 throughholes through which the first aluminum layer electrically connects to the second layer of aluminum.

This layout features that the paired MOS transistors (Q$_0$ and Q$_1$ or Q$_2$ and Q$_3$) of the sense amplifier commonly share the source diffusion layer. In contrast to the layout shown in FIG. 15a, the source diffusion layer is not shared by a MOS transistor constituting a sense amplifier associated with the adjacent data line. Even in the layout of FIG. 18, parasitic resistance also exists in the current flow path extending from the source diffusion layer to the second aluminum layer but this parasitic resistance can be shared as shown in FIG. 19 by the paired MOS transistors constituting one sense amplifier and can be separated from the current flow path in the other sense amplifier associated with the adjacent data line. Accordingly, the previously-described disadvantage that the operation of a data line of interest is affected by data read out to develop on the adjacent data line can be avoided. In other words, this layout can prevent the data pattern dependent noise.

In addition to the above advantage, this layout has an additional advantage that the degree of freedom of design for the channel length of the MOS transistor constituting the sense amplifier can be increased. The gate length of the MOS transistor constituting the sense amplifier is desired to be as long as possible in order to avoid variation in threshold voltage due to the short channel effect. In the layout of FIG. 15a, however, the direction of length of the gate is perpendicular to the direction of wiring of the data line and the gate length can not therefore be sufficiently long by being restricted by the pitch between adjacent data line wiring conductors. In contrast, since in the layout of FIG. 18 the direction of length of the gate is parallel to the direction of wiring of the data line, the gate length can be prolonged by merely causing the length in the data line direction (horizontal direction on the sheet of drawing) to extend slightly and the pitch between adjacent data line wiring conductors can remain unchanged.

Figure 20:
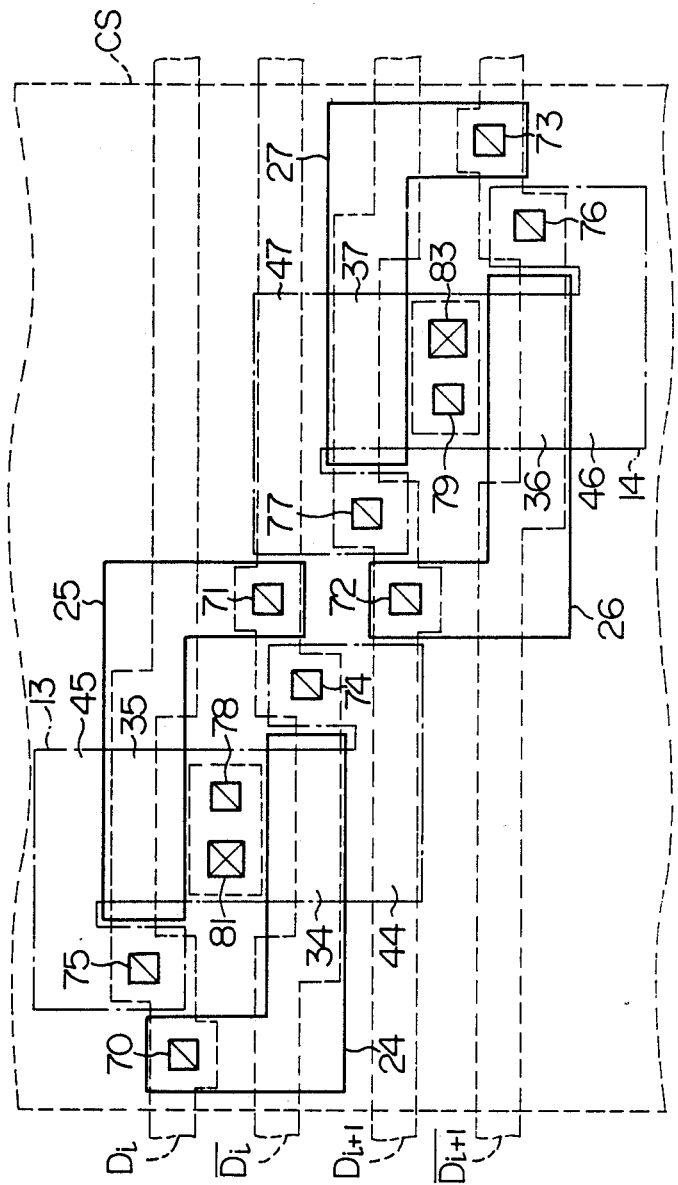
FIG. 20 is a plan view showing a layout of the sense amplifiers according to a modification of the seventh embodiment.

But this embodiment may be modified such that the direction of the gate length of MOS transistor is perpendicular to the direction of wiring of the data line. FIG. 20 shows a layout according to this modification, In FIG. 20, elements identical to or like those of FIG. 18 are designated by the same reference numerals. In this layout, paired MOS transistors of a sense amplifier associated with a data line pair can also commonly share a source diffusion layer and can be separated from a MOS transistor constituting a sense amplifier associated with the adjacent data line pair to thereby ensure that the data pattern dependent noise can be prevented as in the case of the FIG. 18 embodiment. In comparison with the FIG. 18 embodiment, this layout succeeds in slightly reducing the length in the data line direction (horizontal direction on the sheet of drawing) but restricts the degree of freedom of design for the gate length of MOS transistor.

Thus, the seventh embodiment of the invention can prevent the data pattern dependent noise to improve the signal to noise ratio of the sense amplifier and can insure stable operation thereof.

As described above, according to the invention, a very low-noise semiconductor memory can be obtained.

Although in the foregoing the embodiments 1 to 6 are described separately, features of the individual embodiments may obviously be combined with each other. In particular, by combining respective embodiments 1 to 5 with each of the embodiments 6 and 7, a semiconductor memory capable of remarkably reducing the data pattern dependent noise can be obtained.

It is further understood by those skilled in the art that the foregoing describes preferred embodiments of the disclosed device and that various changes and modifications may be made in the invention without departing from the spirit and scope thereof.

We claim:

1. A semiconductor memory comprising:
a plurality of pairs of data lines arranged in substantially parallel relationship with each other, respective pairs having substantially the same electric characteristics;
a plurality of word lines arranged to extend perpendicularly to said data line pairs;
at least one memory cell connected to at least one of intersections of said word lines with data lines of said pairs; and
a plurality of sense amplifier means for differentially detecting signals appearing on each data line pair, said amplifier means electrically connected to said data line pairs,
wherein each of the plurality of sense amplifier means comprises a first sense amplifier that drives one of the data lines in the pair to a low-level voltage and a second sense amplifier that drives the other of the data lines in the pair to a high-level voltage, and the data lines of at least one of said plural data line pairs are transposed in location at a predetermined place along a length of said data line pair, and, said sense amplifier means is operative to change symmetrically voltage on one of the data lines of a pair to a high-level voltage and voltage on the other of the data lines of the pair to a low-level voltage.

2. A semiconductor memory according to claim 1, wherein
said plurality of pairs of data lines being arranged to have an alternate arrangement of a pair of data lines transposed at even number of places and a pair of data lines transposed at an odd number of places.

3. A semiconductor memory according to claim 1 further comprising at least one dummy cell disposed within an interval in which none of said paired data lines are transposed.

4. A semiconductor memory according to claim 1 wherein memory cells are connected to said data line pairs in such a manner that there exists an interval in which connection of memory cells on a selected word line to data lines is effected every other data line when any one of word lines within said interval is selected.

5. A semiconductor memory according to claim 4 wherein memory cells are connected to said data line pairs through a difference wiring layer from a layer for wiring of said data line pairs.

6. A semiconductor memory according to claim 1 wherein the sense amplifier means comprises a pair of cross-coupled transistors for amplifying signals on the data line pair, and a driving signal line for driving said cross-coupled transistors, said paired transistors commonly sharing a source region and a current flow path extending from said source region to said driving signal line.

7. A semiconductor memory according to claim 6 wherein the direction of the gate length of said paired transistors is substantially parallel to the direction of said data line.

8. A semiconductor memory according to claim 1 wherein said sense amplifier means is operative to change voltage on one of the data lines of a pair to a high-level voltage and voltage on the other of the data lines of the pair to a low-level voltage at substantially the same change speed to thereby ensure high symmetricity.

9. A semiconductor memory according to claim 1 further comprising a pair of sense data lines in the sense amplifier section, wherein the pair of sense data lines in the sense amplifier section are transposed.

10. A semiconductor memory comprising:
a plurality of memory cells each of which has a MIS transistor and a capacitor, one of source and drain electrodes of said MIS transistor being electrically connected to one electrode of said capacitor and the other of source and drain electrodes of said MIS transistor being electrically connected to a data lines of a plurality of pairs of data lines for selecting memory cells;
a plurality of word lines for selecting memory cells, each word line being electrically connected to the gate electrode of said MIS transistor; and a plurality of sense amplifier means for detecting signals appearing on data line, electrically connected to said data line pairs, said plurality of pairs of data lines being arranged in substantially parallel to each other as to have an alternate arrangement of a pair of data lines transposed at an even number of places and a pair of data lines transposed at an odd number of places, respective data line pairs having substantially the same electric characteristics, wherein, each of the sense amplifier means comprises a first sense amplifier that drives one of the data line in the pair to a low-level voltage and a second sense amplifier that drives the other of the data lines in the pair to a high-level voltage, one of said plural data line pairs is transposed, and, said sense amplifier means is operative to change symmetrically voltage on one of the data lines of a pair to a high-level voltage and voltage on the other of the data lines of the pair to a low-level voltage.

11. A semiconductor memory according to claim 10 wherein the sense amplifier means comprises a pair of cross-coupled transistors for amplifying signals on the data line pair, and a driving signal line for driving said cross-coupled transistor said paired transistors commonly sharing a source region and a current flow path extending from said source region to said driving signal line.

12. A semiconductor memory according to claim 11 wherein the direction of the gate length of said paired transistors is substantially parallel to the direction of wiring of said data line pair.

13. A semiconductor memory according to claim 11 further comprising at least one dummy cell disposed within an interval in which none of said paired data lines are transposed.

14. A semiconductor memory according to claim 13 wherein memory cells are connected to said data line pairs through a different wiring layer from a layer for wiring of said data line pairs.

15. A semiconductor memory according to claim 11 wherein memory cells are connected to said data line pairs in such a manner that there exists an interval in which connection of memory cells on a selected word line to data lines is effected every other data line when any one of word lines within said interval is selected.

16. A semiconductor memory according to claim 11 wherein said sense amplifier means is operative to change voltage on one of the data lines of a pair to a high-level voltage and voltage on the other of the data lines of the pair to a low-level voltage at substantially the same changed speed to thereby ensure high symmetricity.

17. A semiconductor memory according to claim 11 further comprising a pair of sense data lines in the sense amplifier section, wherein the pair of sense data lines in the sense amplifier section are transposed.

18. A semiconductor memory comprising:
a plurality of memory cells each of which has a MIS transistor and a capacitor, one of source and drain electrodes of said MIS transistor being electrically connected to one electrode of said capacitor and the other of source and drain electrodes of said MIS transistor being electrically connected to a data line of a plurality of pairs of data lines for selecting memory cells;

a plurality of word lines for selecting memory cells, each word line being electrically connected to the gate electrode of said MIS transistor; and a plurality of sense amplifier means for detecting signals appearing on data line, electrically connected to said data line pairs, said plurality of pairs of data lines being arranged in substantially parallel to each other so as to have an alternate arrangement of a pair of data lines transposed at an even number of places and a pair of data lines transposed at an odd number of places, respective data line pairs having substantially the same electric characteristics, wherein, each of the sense amplifier means comprises a first sense amplifier that drives one of the data lines in the pair to a low-level voltage and a second sense amplifier that drives the other of the data lines in the pair to a high-level voltage, a pair of sense data lines electrically connecting the first and second sense amplifier, wherein, at least one of the pair of sense data lines are transposed between the first and second sense amplifier.

19. A semiconductor memory according to claim 18, wherein;
said sense amplifier means is operative to change symmetrically voltage on one of the data lines of a pair to a high-level voltage and voltage on the other of the data lines of the pair of low-level voltage.

20. A semiconductor memory according to claim 19, wherein said sense amplifier means is operative to change voltage on one of the data lines of a pair to a high-level voltage and voltage on the other of the data lines of the pair to a low-level voltage at substantially the same change speed to thereby ensure high symmetricity.

21. A semiconductor memory according to claim 18 wherein the sense amplifier means comprises a pair of cross-coupled transistors for amplifying signals on the data line pair, and a driving signal line for driving said cross-coupled transistor, said paired transistors commonly sharing a source region to said driving signal line.

22. A semiconductor memory according to claim 21 wherein the direction of the gate length of said paired transistors is substantially parallel to the direction of wiring of said data line pair.

23. A semiconductor memory according to claim 21 further comprising at least one dummy cell disposed within an interval in which none of said paired data lines are transposed.

24. A semiconductor memory according to claim 23 wherein memory cells are connected to said data line pairs through a different wiring layer from a layer for wiring of said data line pairs.

25. A semiconductor memory according to claim 21 wherein memory cells are connected to said data line pairs in such a manner that there exists an interval in which connection of memory cells on a selected word line to data lines is effected every other data line when any one of word lines within said interval is selected.

26. A semiconductor memory according to claim 18 wherein some sense amplifier means is operative to change voltage on one of the data lines of a pair to a high-level voltage and voltage on the other of the data lines of the pair to a low-level voltage at substantially the same change speed to thereby ensure high symmetricity.

* * * * *